United States Patent
Jeong

(10) Patent No.: US 10,698,819 B2
(45) Date of Patent: Jun. 30, 2020

(54) MEMORY SYSTEM AND OPERATING METHOD THEREOF

(71) Applicant: SK hynix Inc., Gyeonggi-do (KR)

(72) Inventor: Beom Rae Jeong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 28 days.

(21) Appl. No.: 16/205,678

(22) Filed: Nov. 30, 2018

(65) Prior Publication Data
US 2019/0188134 A1   Jun. 20, 2019

(30) Foreign Application Priority Data

Dec. 14, 2017  (KR) .................. 10-2017-0172063
Oct. 2, 2018   (KR) .................. 10-2018-0117381

(51) Int. Cl.
| | | |
|---|---|---|
| *G06F 12/08* | (2016.01) | |
| *G06F 12/0804* | (2016.01) | |
| *G06F 11/10* | (2006.01) | |
| *G11C 29/52* | (2006.01) | |
| *G11C 29/04* | (2006.01) | |

(52) U.S. Cl.
CPC ...... *G06F 12/0804* (2013.01); *G06F 11/1064* (2013.01); *G06F 11/1068* (2013.01); *G11C 29/52* (2013.01); *G06F 2212/1008* (2013.01); *G06F 2212/608* (2013.01); *G11C 2029/0411* (2013.01)

(58) Field of Classification Search
CPC ............... G06F 12/0246; G06F 3/0659; G06F 11/1012; G06F 3/061; G06F 3/0688; G06F 2212/7203; G06F 12/0804; G06F 11/1064; G06F 11/1068; G06F 2212/1008; G06F 2212/608; G11C 29/52; G11C 2029/0411

USPC ........................................................ 711/103
See application file for complete search history.

(56) References Cited

U.S. PATENT DOCUMENTS

| | | | | |
|---|---|---|---|---|
| 5,701,516 A | * | 12/1997 | Cheng ................. | G06F 12/0804 710/22 |
| 8,838,879 B2 | * | 9/2014 | Yoshida .............. | G06F 12/0607 710/52 |
| 2011/0022801 A1 | * | 1/2011 | Flynn ................... | G06F 9/52 711/120 |
| 2012/0159016 A1 | * | 6/2012 | Morita ................. | G06F 13/1673 710/33 |
| 2012/0159050 A1 | * | 6/2012 | Yano ................... | G06F 13/1668 711/103 |
| 2013/0191609 A1 | * | 7/2013 | Kunimatsu ........... | G06F 12/10 711/203 |
| 2013/0282967 A1 | * | 10/2013 | Ramanujan .......... | G06F 12/0246 711/103 |

(Continued)

FOREIGN PATENT DOCUMENTS

KR      101212739      12/2012

*Primary Examiner* — Shawn X Gu
*Assistant Examiner* — Jean C Edouard
(74) *Attorney, Agent, or Firm* — IP & T Group LLP

(57) ABSTRACT

A memory system may include: a nonvolatile memory device including a memory cell array and a page buffer coupled to the memory cell array; and a controller configured to interface with the nonvolatile memory device, wherein the controller moves descriptors on a cache command from a command queue to a cache queue, the cache command being transferred to the nonvolatile memory device, and selectively moves the descriptors moved to the cache queue to a response queue.

19 Claims, 15 Drawing Sheets

(56) References Cited

U.S. PATENT DOCUMENTS

| | | | |
|---|---|---|---|
| 2014/0068159 A1* | 3/2014 | Yi | G06F 12/0246 |
| | | | 711/103 |
| 2014/0223073 A1* | 8/2014 | Benisty | G06F 12/0246 |
| | | | 711/103 |
| 2015/0149728 A1* | 5/2015 | Moon | G06F 12/0868 |
| | | | 711/133 |
| 2016/0011779 A1* | 1/2016 | Lee | G06F 3/061 |
| | | | 711/103 |
| 2018/0005670 A1* | 1/2018 | Lee | G06F 3/0644 |

* cited by examiner

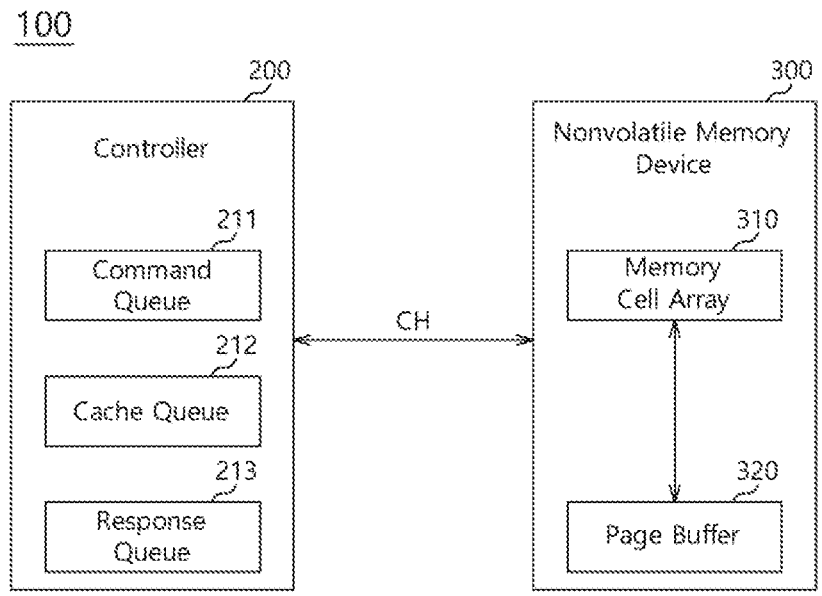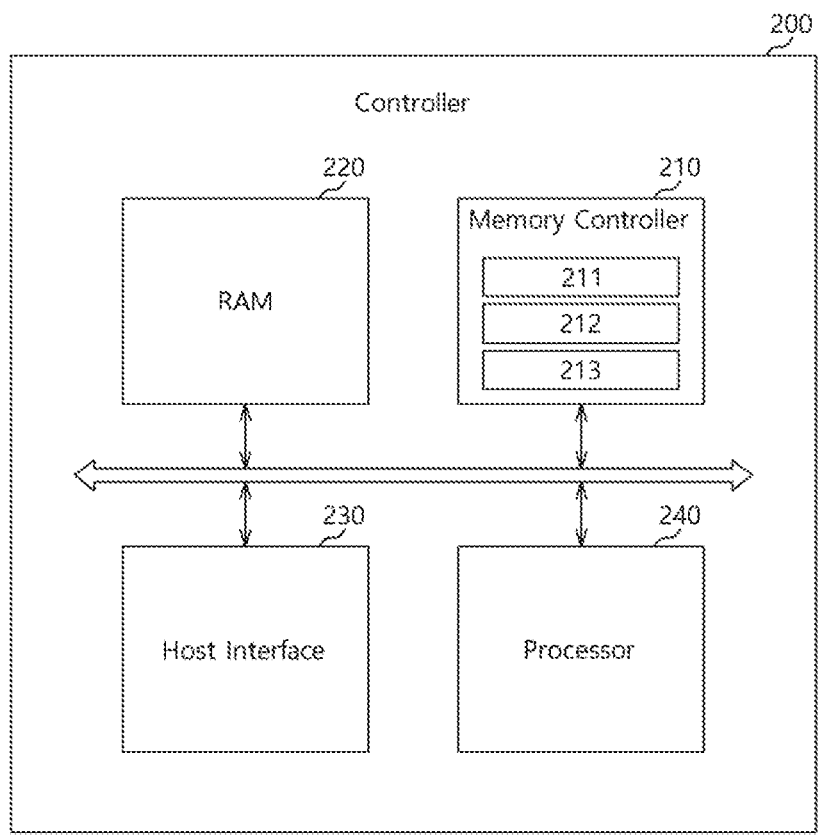

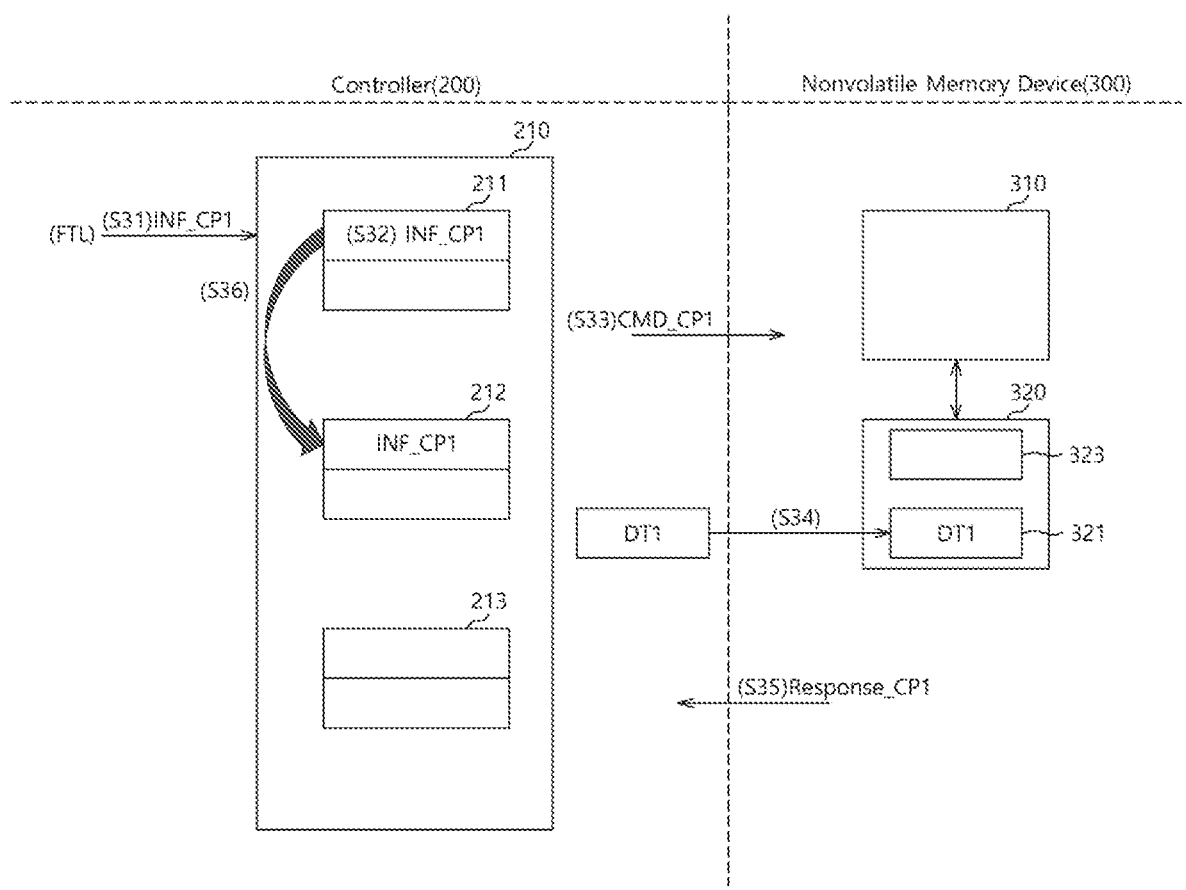

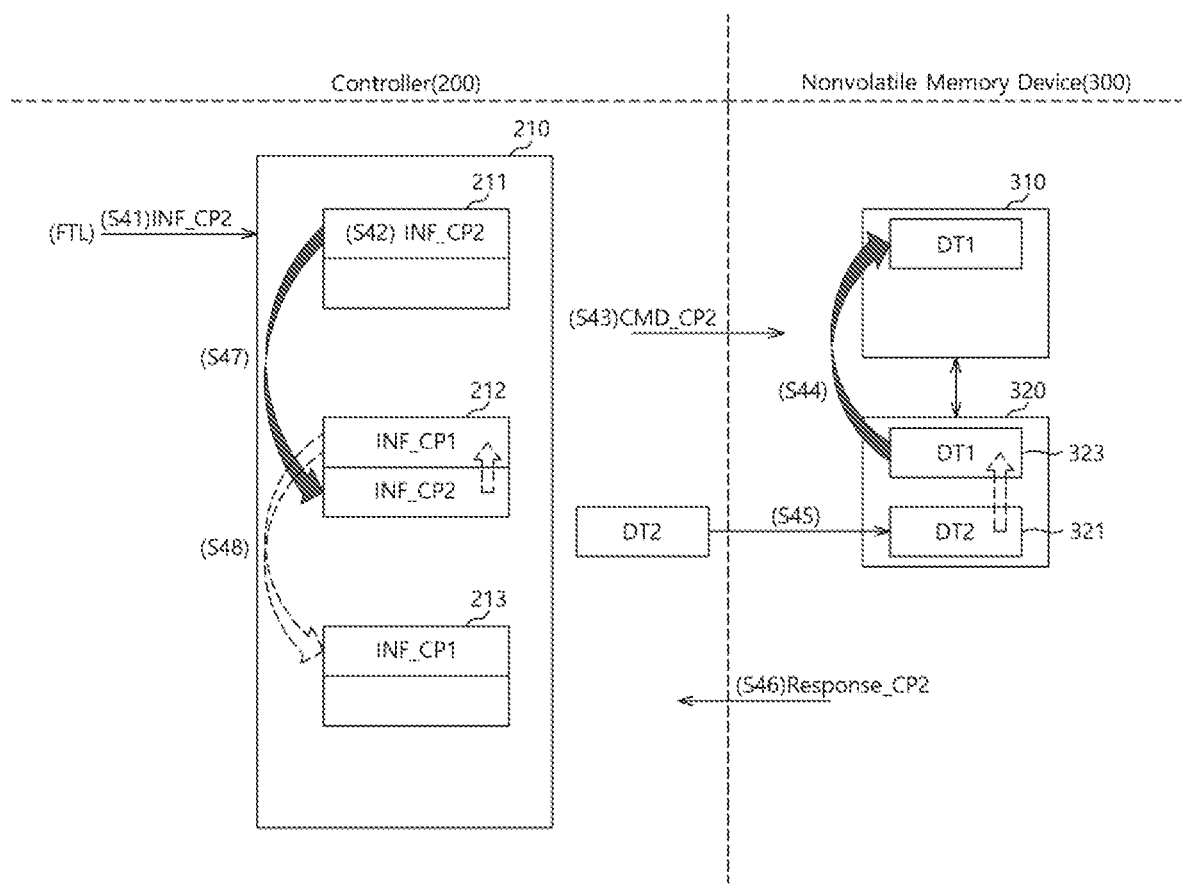

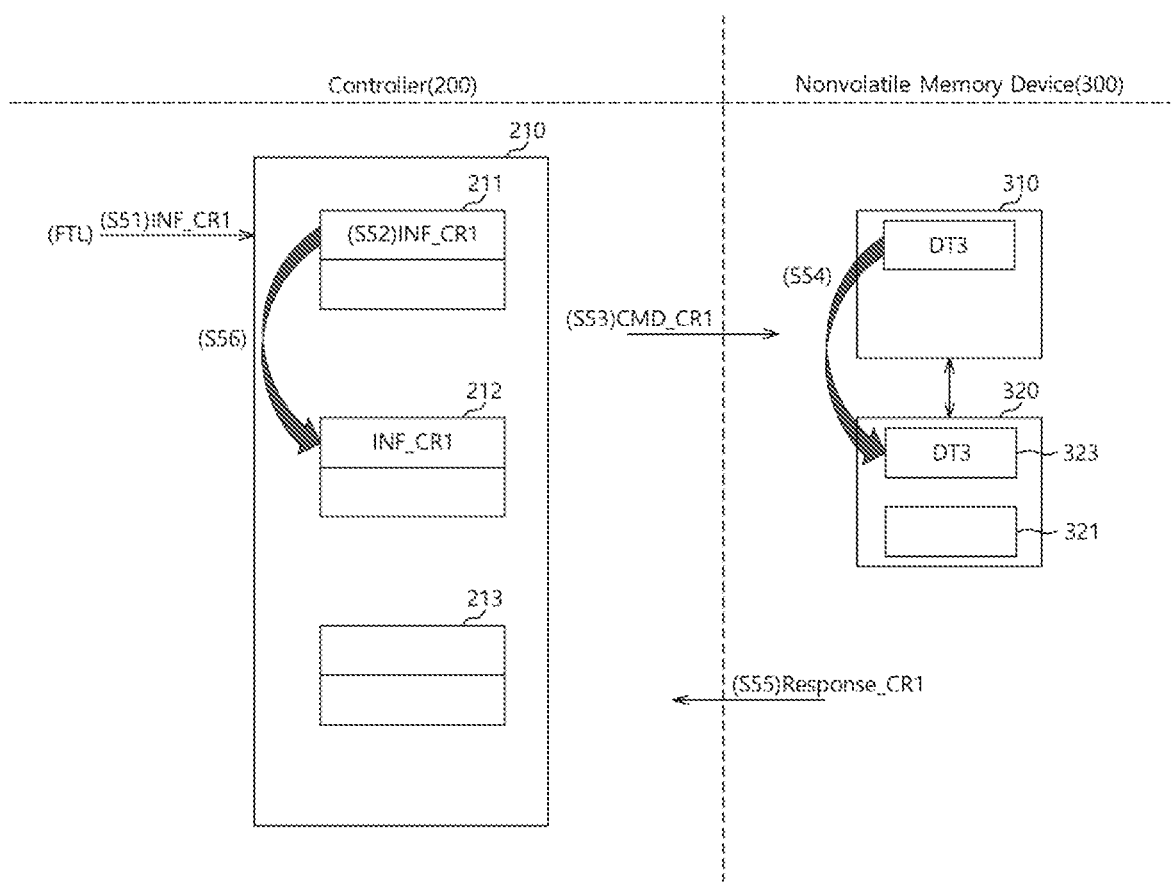

MEMORY SYSTEM AND OPERATING METHOD THEREOF

CROSS-REFERENCES TO RELATED APPLICATIONS

The present application claims priority under 35 U.S.C. § 119(a) to Korean application number 10-2017-0172063, filed on Dec. 14, 2017, and Korean application number 10-2018-0117381, filed on Oct. 2, 2018, in the Korean Intellectual Property Office, which is incorporated herein by reference in its entirety.

BACKGROUND

1. Technical Field

Various embodiments of the present invention generally relate to a memory system. Particularly, the embodiments relate to a memory system including a nonvolatile memory device and an operating method thereof.

2. Related Art

A memory system may be configured to store the data provided from an external device, in response to a write request from the external device. Also, the memory system may be configured to provide stored data to the external device, in response to a read request from the external device. The external device as an electronic device capable of processing data may include a computer, a digital camera or a mobile phone. The memory system may operate by being built in the external device, or may operate by being manufactured in a separable form and being coupled to the external device.

Since there is no mechanical driving part, a memory system including a memory device provides advantages such as excellent stability and durability, high information access speed, and low power consumption. Memory systems having such advantages include a universal serial bus (USB) memory device, memory cards having various interfaces, a universal flash storage (UFS) device, and a solid state drive (SSD).

SUMMARY

Various embodiments are directed to a memory system and an operating method thereof in which a controller is capable of accurately determining a result of performing a cache operation.

In an embodiment, a memory system may include: a nonvolatile memory device including a memory cell array and a page buffer coupled to the memory cell array; and a controller configured to interface with the nonvolatile memory device, wherein the controller moves descriptors on a cache command from a command queue to a cache queue, the cache command being transferred to the nonvolatile memory device, and selectively moves the descriptors moved to the cache queue to a response queue.

In an embodiment, a method for operating a memory system may include: storing, by a controller, descriptors for a cache operation on a nonvolatile memory device in a command queue; generating, by the controller, a cache command based on the descriptors, and transferring the cache command to the nonvolatile memory device; performing, by the nonvolatile memory device, a cache operation based on the cache command; transferring, by the nonvolatile memory device, status information containing a result of the cache operation to the controller; and moving, the controller, the descriptors from the command queue to a cache queue when the status information is received from the nonvolatile memory device.

In an embodiment, a memory system may include: a memory device configured to perform a cache operation including at least a succeeding sub-operation of buffering data into a page buffer according to a succeeding cache descriptor; and a controller configured to generate the succeeding cache descriptor and to secure, even when a previous cache operation succeeds, the succeeding cache descriptor of the previous cache operation at least until a preceding sub-operation of processing the buffered data succeeds, the preceding sub-operation being included in a subsequent cache operation.

BRIEF DESCRIPTION OF THE DRAWINGS

FIG. 1 is a block diagram illustrating a memory system in accordance with an embodiment of the present disclosure.

FIG. 2 is a block diagram a configuration of a controller of FIG. 1.

FIG. 3 is a diagram illustrating a process in which a first cache program descriptors is moved to a cache queue when a first cache program operation is performed.

FIG. 4 is a diagram illustrating a process in which a first cache program descriptors is moved to a response queue when a second cache program operation is performed.

FIG. 5 is a diagram illustrating a process in which a first cache read descriptors is moved to the cache queue when a first cache read operation is performed.

DETAILED DESCRIPTION

Figure 6:
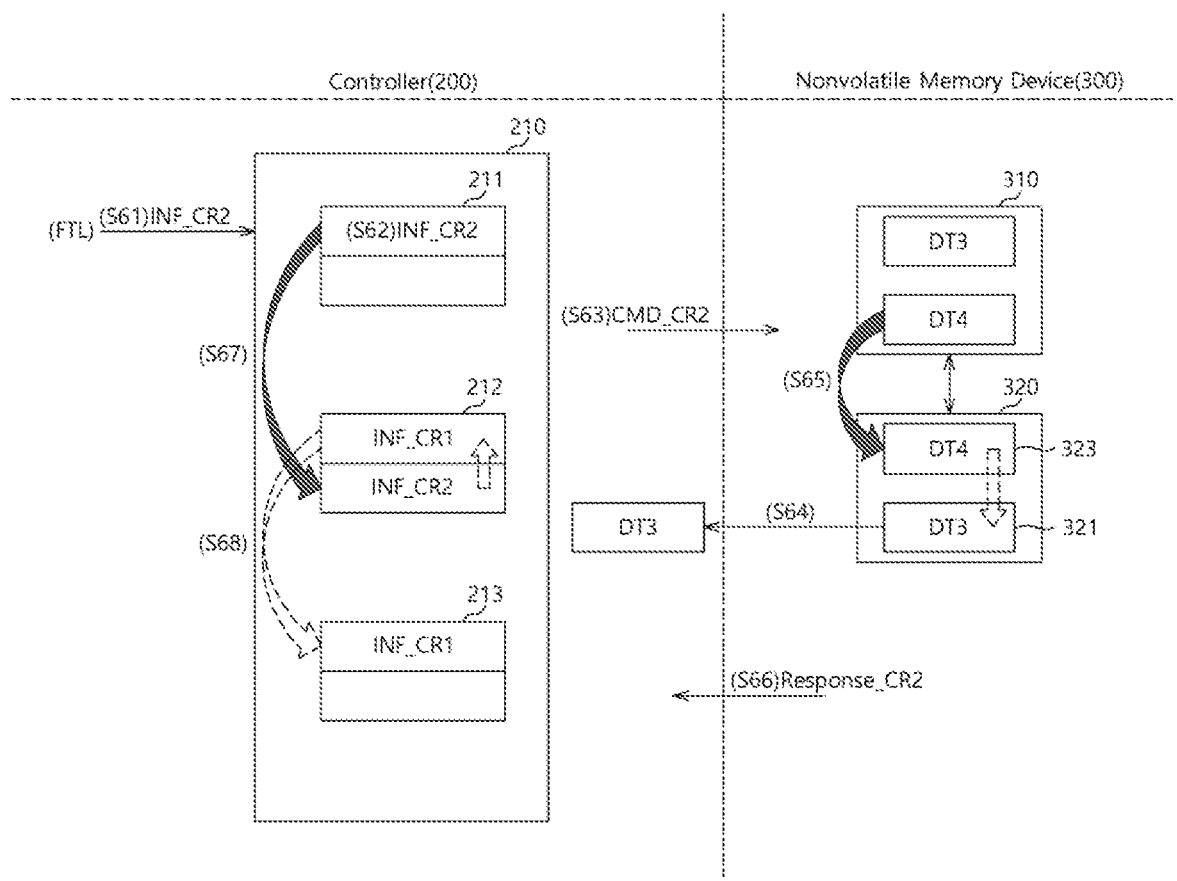
FIG. 6 is a diagram illustrating a process in which the first cache read descriptors is moved to the response queue when a second cache read operation is performed.

In the present invention, advantages, features and methods for achieving them will become more apparent after a reading of the following exemplary embodiments taken in conjunction with the drawings. The present invention may, however, be embodied in different forms and should not be construed as being limited to the embodiments set forth herein. Rather, these embodiments are provided to describe the present invention in detail to the extent that a person skilled in the art to which the invention pertains can easily enforce the technical concept of the present invention. It is noted that reference to "an embodiment" does not necessarily mean only one embodiment, and different references to "an embodiment" are not necessarily to the same embodiment(s).

It is to be understood herein that embodiments of the present invention are not limited to the particulars shown in the drawings and that the drawings are not necessarily to scale and in some instances proportions may have been exaggerated in order to more clearly depict certain features of the invention. While particular terminology is used herein, it is to be appreciated that the terminology used herein is for the purpose of describing particular embodiments only and is not intended to limit the scope of the present invention.

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes" and/or "including," when used in this specification, specify the presence of at least one stated feature, step, operation, and/or element, but do not preclude the presence or addition of one or more other features, steps, operations, and/or elements thereof.

Hereafter, exemplary embodiments will be described in detail with reference to the accompanying drawings.

FIG. 1 is a block diagram illustrating a memory system 100 in accordance with an embodiment of the present disclosure, and FIG. 2 is a block diagram illustrating the configuration of a controller 200 of FIG. 1 in detail.

The memory system 100 may store data to be accessed by a host device (not shown) such as a mobile phone, an MP3 player, a laptop computer, a desktop computer, a game player, a TV, an in-vehicle infotainment system, and so forth.

The memory system 100 may be manufactured as any one of various kinds of storage devices according to a host interface meaning a transmission protocol with respect to the host device. For example, the memory system 100 may be configured as any one of various kinds of storage devices such as a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and so forth.

The memory system 100 may be manufactured as any one among various kinds of package types. For example, the memory system 100 may be manufactured as any one of various kinds of package types such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

Referring to FIG. 1, the memory system 100 may include the controller 200 and a nonvolatile memory device 300. Referring to FIG. 2, the controller 200 may include a memory controller 210, a random access memory (RAM) 220, a host interface 230 and a processor 240.

The memory controller 210 may control the nonvolatile memory device 300 according to control of the processor 240. The memory controller 210 may also be referred to as a memory interface. The memory controller 210 may provide control signals to the nonvolatile memory device 300. The control signals may include a command, address and operation control signal for controlling the nonvolatile memory device 300. The memory controller 210 may provide data to the nonvolatile memory device 300, or receive data from the nonvolatile memory device 300.

The memory controller 210 may include a command queue 211, a cache queue 212 and a response queue 213.

The nonvolatile memory device 300 may perform a cache operation such as a cache program operation or cache read operation.

The cache program operation may include an operation of programming previous data, which is stored in a page buffer 320 through the previous cache program operation, to a memory cell array 310 and an operation of storing subsequent data in the page buffer 320, the subsequent data being be programmed to the memory cell array 310 next to the previous data. The operation of programming the previous data to the memory cell array 310 and the operation of storing the subsequent data in the page buffer 320 may be performed at the same time. The nonvolatile memory device 300 may minimize the time required for an operation of programming data to the memory cell array 310 through the cache program operation.

The cache read operation may include an operation of transferring previous data to the memory controller 210, the previous data being read from the memory cell array 310 and stored in the page buffer 320 through the previous cache read operation, and an operation of reading subsequent data from the memory cell array 310 and storing the subsequent data in the page buffer 320, the subsequent data being to be transferred to the memory controller 210 next to the previous data. The operation of transferring the previous data to the memory controller 210 and the operation of reading and storing the subsequent data in the page buffer 320 may be performed at the same time. The nonvolatile memory device 300 may minimize the time required for an operation of reading data stored in the memory cell array 310 through the cache read operation.

In the present embodiment, first to $n^{th}$ information (hereafter, referred to as 'descriptors') may be a kind of a work order describing works which the memory controller 210 is required to process in order to control the nonvolatile memory device 300. The descriptors may include information on data to be stored in the nonvolatile memory device 300, address information indicating the storage location where data is to be stored within the nonvolatile memory device 300, and address information indicating the storage location where data to be read is stored within the nonvolatile memory device 300. However, the present embodiment is not limited thereto, but the descriptors may include various pieces of information required for operations of the nonvolatile memory device 300.

In order to complete a single cache program operation, there may be required a succeeding cache program command for programming the buffered previous program data into the memory cell array 310 and for buffering subsequent program data in the page buffer 320, and a preceding cache program command for buffering the previous program data in the page buffer 320. In order to complete a single cache read operation, there may be required a succeeding cache read command for transferring the buffered previous read data to the memory controller 210 and for reading out subsequent read data from the memory cell array 310 into the page buffer 320, and a preceding cache read command for reading out the previous read data from the memory cell array 310 into the page buffer 320.

The preceding cache program command and the succeeding cache program command may correspond to the preceding cache program descriptor and the succeeding cache program descriptor, respectively. The preceding cache read command and the succeeding cache read command may correspond to the preceding cache read descriptor and the succeeding cache read descriptor, respectively.

The descriptors may be generated by a flash translation layer (FTL) for controlling overall operations of the memory system 100, and transferred to the memory controller 210. The memory controller 210 may store the descriptors provided from the FTL in the command queue 211, and generate a command to provide to the nonvolatile memory device 300, based on the stored descriptors.

The nonvolatile memory device 300 may perform an operation according to the command provided from the memory controller 210, and transfer status information containing the operation result to the memory controller 210. The operation result may include information indicating the completion of the operation and information indicating a pass or fail of the operation. Based on the status information provided from the nonvolatile memory device 300, the memory controller 210 may move the corresponding descriptor from the command queue 211 to the response queue 213 and delete the corresponding descriptor from the command queue 211, or just delete the descriptor from the command queue 211 without moving the corresponding descriptor to the response queue 213.

For example, when the status information includes information indicating a pass of the operation, the memory controller 210 may delete the descriptors from the command queue 211 without moving the corresponding descriptor from the command queue 211 to the response queue 213. When the status information includes information indicating a fail of the operation, the memory controller 210 may move the corresponding descriptors from the command queue 211 to the response queue 213, and then delete the corresponding descriptors from the command queue 211. Since the descriptors stored in the response queue 213 indicate a failed operation, the processor 240 may re-transfer the descriptors for the failed operation to the memory controller 210, based on the descriptors stored in the response queue 213, and the memory controller 210 may re-provide to the nonvolatile memory device 300 with a command corresponding to the re-transferred descriptors.

For example, when a single cache program operation succeeds, the corresponding succeeding cache program descriptor may be deleted from the command queue 211. Also, when a single cache program operation fails, the corresponding succeeding cache program descriptor may be moved into the response queue 213 and may be deleted from the command queue 211. For example, when a single cache read operation succeeds, the corresponding succeeding cache read descriptor may be deleted from the command queue 211. Also, when a single cache read operation fails, the corresponding succeeding cache read descriptor may be moved into the response queue 213 and may be deleted from the command queue 211.

As described above, data programmed to the memory cell array 310 during the cache program operation may indicate data stored in the page buffer 320 through the previously performed cache program operation. When a program operation of storing data in the memory cell array 310 fails, the nonvolatile memory device 300 may transfer status information to the memory controller 210, the status information including a processing fail in a command for the failed program operation (for example, a cache program command), and the memory controller 210 may move descriptors from the command queue 211 to the response queue 213, the descriptors associated with the command corresponding to the status information received from the nonvolatile memory device 300.

As a result, descriptors associated with a command for storing data in the page buffer 320 of the nonvolatile memory device 300, the data indicating data to be programmed to the memory cell array 310 at the next turn, may be moved to the response queue 213, instead of the descriptors associated with the command for storing data in the page buffer 320 of the nonvolatile memory device 300, the data indicating data which failed to be stored in the memory cell array 310.

Furthermore, the data transferred to the memory controller 210 from the nonvolatile memory device 300 during the cache read operation may indicate data which is read from the memory cell array 310 through the previously performed cache read operation and stored in the page buffer 320.

The memory controller 210 may decode data received from the nonvolatile memory device 300. The decoding operation may include detecting an error contained in the data and correcting the detected error. For this operation, the memory controller 210 may include an error correction code (ECC) circuit (not illustrated) for decoding the data received from the nonvolatile memory device 300.

When the decoding of the data received from the nonvolatile memory device 300 fails, the memory controller 210 may move descriptors from the command queue 211 to the response queue 213, the descriptors associated with a command corresponding to a cache read operation through which the corresponding data (decoding-failed data) was transferred.

As a result, descriptors associated with a command for reading data from the memory cell array 310 and storing the read data in the page buffer 320, the data indicating data to be transferred at the next turn, may be moved to the response queue 213, instead of descriptors associated with the command for reading the decoding-failed data from the memory cell array 310 of the nonvolatile memory device 300 and storing the read data in the page buffer 320.

In the present embodiment, the controller 200 may further include the cache queue 212, move descriptors associated with completely processed commands from the command queue 211 to the cache queue 212, and selectively move the descriptors stored in the cache queue 212 to the response queue 213 according to whether the commands fail to be processed.

Therefore, when a cache program operation or a cache read operation fail occurs, descriptors associated with a command for storing program-failed data in the page buffer 320 or a command for reading read-failed data from the memory cell array 310 and storing the read data in the page buffer 320 may be correctly stored in the response queue 213, instead of the descriptors associated with the command for programming data stored in the page buffer 320 to the memory cell array 310 or the command for transferring data stored in the page buffer 320 to the controller 200. This operation will be described in detail with reference to FIGS. 3 to 6 which will be described below.

The RAM 220 may include a dynamic RAM (DRAM) or static RAM (SRAM). The RAM 220 may store firmware FW driven by the processor 240. Furthermore, the RAM 220 may store data required for driving the firmware FW, for example, meta data. That is, the RAM 220 may operate as a working memory of the processor 240.

The RAM 220 may temporarily store data which is provided from a host device and will be provided to the nonvolatile memory device 300, and data which is received from the nonvolatile memory device 300 and will be transferred to the host device. That is, the RAM 220 may operate as a buffer memory.

The host interface 230 may interface the host device and the memory system 100. For example, the host interface 230 may communicate with the host device using one or more of standard transfer protocols such as secure digital, USB (Universal Serial Bus), MMC (Multi-Media Card), eMMC (Embedded MMC), PCMCIA (Personal Computer Memory Card International Association), PATA (Parallel Advanced Technology Attachment), SATA (Serial Advanced Technology Attachment), SCSI (Small Computer System Interface), SAS (Serial Attached SCSI), PCI (Peripheral Component Interconnection), PCI-E (PCI Express) and UFS (Universal Flash Storage).

The processor 240 may include a micro control unit (MCU) and a central processing unit (CPU). The processor 240 may process a request received from the host device. In order to process the request, the processor 240 may drive a code-based instruction or algorithm loaded to the RAM 220, i.e. the firmware FW, and control the internal function blocks and the nonvolatile memory device 300.

FIG. 3 illustrates a process of moving first information (hereafter, referred to as 'first cache program descriptors') INF_CP1 to the cache queue 212, after a first cache program operation is completed. Hereafter, referring to FIGS. 2 and 3, a process of performing the first cache program operation for first data (hereafter, referred to as 'first program data') DT1 and a process of moving the first cache program descriptors INF_CP1 corresponding to the first cache program operation from the command queue 211 to the cache queue 212 will be described in detail.

At step S31, the first cache program descriptors INF_CP1 generated through the FTL may be transferred to the memory controller 210. The first cache program descriptors INF_CP1 for the first cache program operation may include information on the first program data DT1 and address information of the nonvolatile memory device 300, where the first program data DT1 is to be stored.

At step S32, the memory controller 210 may store the first cache program descriptors INF_CP1 in the command queue 211.

At step S33, the memory controller 210 may generate a first cache program command CMD_CP1 based on the first cache program descriptors INF_CP1 stored in the command queue 211, and transfer the generated first cache program command CMD_CP1 to the nonvolatile memory device 300.

At step S34, the first program data DT1 stored in the RAM 220 of the controller 200 may be transferred to the nonvolatile memory device 300, and the nonvolatile memory device 300 may store the received first program data DT1 in the page buffer 320 based on the first cache program command CMD_CP1.

As the first program data DT1 is stored in the page buffer 320, the first cache program operation may be completed.

At step S35, the nonvolatile memory device 300 may transfer first status information Response_CP1 containing the result of the first cache program operation to the controller 200.

At step S36, the memory controller 210 receiving the first status information Response_CP1 from the nonvolatile memory device 300 may move the first cache program descriptors INF_CP1 from the command queue 211 to the cache queue 212. That is, when the first status information Response_CP1 is received from the nonvolatile memory device 300, the memory controller 210 may determine that the first cache program command is completed, and move the first cache program descriptors INF_CP1 corresponding to the first cache program command from the command queue 211 to the cache queue 212. Furthermore, the memory controller 210 may delete the first cache program descriptors INF_CP1 from the command queue 211, after moving the first cache program descriptors INF_CP1 to the cache queue 212.

FIG. 4 illustrates a process of moving the first cache program descriptors INF_CP1 from the cache queue 212 to the response queue 213 after a second cache program operation is completed. Hereafter, referring to FIGS. 2 to 4, a process of performing a second cache program operation on second program data DT2 and a process of moving the first cache program descriptors INF_CP1 from the cache queue 212 to the response queue 213 will be described in detail. For convenience of description, suppose that the first program data DT1 is stored in a first data buffer 321 of the page buffer 320 and the first cache program descriptors INF_CP1 is stored in the cache queue 212, as illustrated in FIG. 3.

Steps S41 to S43 may be performed in the same manner as steps S31 to S33 described above, respectively. That is, the memory controller 210 may receive second information (hereafter, referred to as 'second cache program descriptors') INF_CP2 for the second cache program operation from the FTL, store the second cache program descriptors INF_CP2 in the command queue 211, generate a second cache program command CMD_CP2 based on the second cache program descriptors INF_CP2 stored in the command queue 211, and transfer the generated second cache program command CMD_CP2 to the nonvolatile memory device 300. For example, the second cache program command CMD_CP2 may include a command for programming the first program data DT1 stored in the page buffer 320 to the memory cell array 310 and a command for buffering second data (hereafter, referred to as 'second program data') DT2 in the page buffer 320.

At step S44, the first program data DT1 stored in the first data buffer 321 of the page buffer 320 through the first cache program operation may be moved to a second data buffer 323 of the page buffer 320, and then programmed to the memory cell array 310.

At step S45, the second program data DT2 stored in the RAM 220 of the controller 200 may be transferred to the nonvolatile memory device 300, and the nonvolatile memory device 300 may store the second program data DT2 in the first data buffer 321 of the page buffer 320 based on the second cache program command CMD_CP2.

That is, while the first program data DT1 moved to the second data buffer 323 is programmed to the memory cell array 310, the second program data DT2 may be stored in the first data buffer 321 of the page buffer 320. In an embodiment, steps S44 and S45 may be performed at the same time.

As steps S44 and S45 are completed, the second cache program operation may be completed.

At step S46, the nonvolatile memory device 300 may transfer second status information Response_CP2 containing the result of the second cache program operation to the controller 200.

At step S47, the memory controller 210 receiving the second status information Response_CP2 from the nonvolatile memory device 300 may move the second cache program descriptors INF_CP2 from the command queue 211 to the cache queue 212.

That is, when the second status information Response_CP2 is received from the nonvolatile memory device 300, the memory controller 210 may determine that the second cache program command is completed, and move the second cache program descriptors INF_CP2 corresponding to the second cache program command from the command queue 211 to the cache queue 212. Furthermore, the memory controller 210 may delete the second cache program descriptors INF_CP2 stored in the command queue 211, after moving the second cache program descriptors INF_CP2 to the cache queue 212.

The second status information Response_CP2 may include information indicating a pass or fail of the second cache program operation. The pass or fail of the second cache program operation may indicate whether the first program data DT1 is normally programmed to the memory cell array 310 or failed to be programmed.

At step S48, the memory controller 210 may selectively move the first cache program descriptors INF_CP1 from the cache queue 212 to the response queue 213, based on the second status information Response_CP2.

For example, when the second status information Response_CP2 includes information indicating a pass of the second cache program operation, it may indicate that the first program data DT1 is normally programmed to the memory cell array 110. In this case, since a program command for the first program data DT1 does not need to be re-transferred to the nonvolatile memory device 300, the memory controller 210 may not move the first cache program descriptors INF_CP1 from the cache queue 212 to the response queue 213, but delete the first cache program descriptors INF_CP1 from the cache queue 212.

When the second status information Response_CP2 includes information indicating a fail of the second cache program operation, it may indicate that the first program data DT1 is not programmed to the memory cell array 310. In this case, since the program command for the first program data DT1 needs to be re-transferred to the nonvolatile memory device 300, the memory controller 210 may move the first cache program descriptors INF_CP1 from the cache queue 212 to the response queue 213, and delete the first cache program descriptors INF_CP1 from the cache queue 212. Therefore, the descriptors (i.e., the first cache program descriptors) on the first cache program operation related to the first program data DT1 may be secured.

When the first cache program descriptors INF_CP1 is deleted from the cache queue 212 at step S48, the memory controller 210 may move the second cache program descriptors INF_CP2 to the storage location of the first cache program descriptors INF_CP1. However, the present embodiment is not limited thereto.

In the present embodiment, the controller 200 may store the first cache program descriptors INF_CP1 on the first cache program operation in the cache queue 212, and selectively store the first cache program descriptors INF_CP1 in the response queue 213 based on the second status information Response_CP2 of the subsequent second cache program operation. Thus, the controller 200 can correctly determine descriptors related to data which are not programmed in the memory cell array 310. That is, descriptors related to program-failed data can be secured, and a program operation for the program-failed data can be performed again, based on the secured descriptors, which makes it possible to improve the reliability of the memory system 100.

FIG. 5 illustrates a process of moving third information (hereafter, referred to as 'first cache read descriptors') INF_CR1 to the cache queue 212, after a first cache read operation is completed. Hereafter, referring to FIGS. 2 and 5, a process of performing the first cache read operation for third data ((hereafter, referred to as 'first read data') DT3 and a process of moving the first cache read descriptors INF_CR1 corresponding to the first cache read operation from the command queue 211 to the cache queue 212 will be described in detail.

At step S51, the first cache read descriptors INF_CR1 generated through the FTL may be transferred to the memory controller 210. The first cache read descriptors INF_CR1 for the first cache read operation may include address information of the nonvolatile memory device 300, where the first read data DT3 is stored.

At step S52, the memory controller 210 may store the first cache read descriptors INF_CR1 in the command queue 211.

At step S53, the memory controller 210 may generate a first cache read command CMD_CR1 based on the first cache read descriptors INF_CR1 stored in the command queue 211, and transfer the generated first cache read command CMD_CR1 to the nonvolatile memory device 300. For example, the first cache read command CMD_CR1 may include a command for reading the first read data DT3 from the memory cell array 310 and storing the read data in the second data buffer 323 of the page buffer 320.

At step S54, the nonvolatile memory device 300 may read the first read data DT3 from the memory cell array 310 and store the first read data DT3 in the second data buffer 323 of the page buffer 320, based on the first cache read command CMD_CR1.

When step S54 is completed, the first cache read operation may be completed.

At step S55, the nonvolatile memory device 300 may transfer first status information Response_CR1 containing the result of the first cache read operation to the memory controller 210.

At step S56, the memory controller 210 receiving the first status information Response_CR1 from the nonvolatile memory device 300 may move the first cache read descriptors INF_CR1 from the command queue 211 to the cache queue 212. That is, when the first status information Response_CR1 is provided from the nonvolatile memory device 300, the memory controller 210 may determine that the first cache read command is completed, and move the first cache read descriptors INF_CR1 corresponding to the first cache read command from the command queue 211 to the cache queue 212. Furthermore, the memory controller 210 may delete the first cache read descriptors INF_CR1 from the command queue 211, after moving the first cache read descriptors INF_CR1 to the cache queue 212.

FIG. 6 illustrates a process of moving the first cache read descriptors INF_CR1 from the cache queue 212 to the response queue 213 after a second cache read operation is completed. Hereafter, referring to FIGS. 2, 5 and 6, a process of performing the second cache read operation for fourth data (hereafter, referred to as 'second read data') DT4 and a process of moving the first cache read descriptors INF_CR1 from the cache queue 212 to the response queue 213 will be described in detail. For convenience of description, suppose that the first read data DT3 is stored in the second data buffer 323 of the page buffer 320 and the first cache read descriptors INF_CR1 is stored in the cache queue 212, as illustrated in FIG. 5.

Steps S61 to S63 may be performed in the same manner as steps S51 to S53 described above, respectively. That is, the memory controller 210 may receive fourth information (hereafter, referred to as 'second cache read descriptors') INF_CR2 for the second cache read operation from the FTL, store the second cache read descriptors INF_CR2 in the command queue 211, generate a second cache read command CMD_CR2 based on the second cache read descriptors INF_CR2 stored in the command queue 211, and transfer the generated second cache read command CMD_CR2 to the nonvolatile memory device 300. For example, the second cache read command CMD_CR2 may include a command for outputting the first read data DT3 stored in the page buffer 320 to the controller 200, and a command for reading the second read data DT4 from the memory cell array 310 and storing the second read data DT4 in the page buffer 320.

At step S64, based on the second cache read command CMD_CR2, the nonvolatile memory device 300 may move the first read data DT3 stored in the second data buffer 323 of the page buffer 320 to the first data buffer 321 and transfer the first read data DT3 from the first data buffer 321 to the memory controller 210. When the first read data DT3 is completely transferred, the first read data DT3 within the first data buffer 321 of the page buffer 320 may be deleted.

At step S65, the nonvolatile memory device 300 may read the second read data DT4 from the memory cell array 310 and store the read second read data DT4 in the second data buffer 323 of the page buffer 320, based on the second cache read command CMD_CR2. Steps S64 and S65 may be performed at the same time.

When steps S64 and S65 are completed, the second cache read operation may be completed.

At step S66, the nonvolatile memory device 300 may transfer second status information Response_CR2 containing the result of the second cache read operation to the memory controller 210.

At step S67, the memory controller 210 receiving the second status information Response_CR2 from the nonvolatile memory device 300 may move the second cache read descriptors INF_CR2 from the command queue 211 to the cache queue 212. Furthermore, the memory controller 210 may delete the second cache read descriptors INF_CR2 stored in the command queue 211.

At step S68, the memory controller 210 may decode the first read data DT3 received from the nonvolatile memory device 300 using an ECC circuit. The decoding may include ECC decoding, for example. When the decoding of the first read data DT3 passes, the controller 200 may transfer the first read data DT3 to the host device, and the memory controller 210 may delete the first cache read descriptors INF_CR1 from the cache queue 212.

When the decoding of the first read data DT3 fails, the memory controller 210 may move the first cache read descriptors INF_CR1 from the cache queue 212 to the response queue 213, and delete the first cache read descriptors INF_CR1 from the cache queue 212. Therefore, the descriptors (i.e., first cache read descriptors) on the first cache read operation related to the first read data DT3 may be secured.

When the first cache read descriptors INF_CR1 is deleted from the cache queue 212 at step S68, the memory controller 210 may move the second cache read descriptors INF_CR2 to the storage location of the first cache read descriptors INF_CR1. However, the present embodiment is not limited thereto.

In the present embodiment, the controller 200 may store the first cache read descriptors INF_CR1 on the first cache read operation in the cache queue 212, and selectively store the first cache read descriptors INF_CR1 in the response queue 213 based on the decoding result of the first read data DT3 transferred through the subsequent second cache read operation. Thus, the controller 200 can correctly determine descriptors related to read-failed data. That is, the descriptors related to the read-failed data can be secured, and a read operation for the read-failed data can be performed again based on the secured descriptors, which makes it possible to improve the reliability of the memory system 100.

FIGS. 7 to 11B are flowcharts for describing an operating method of the memory system 100 in accordance with an embodiment.

Figure 7:
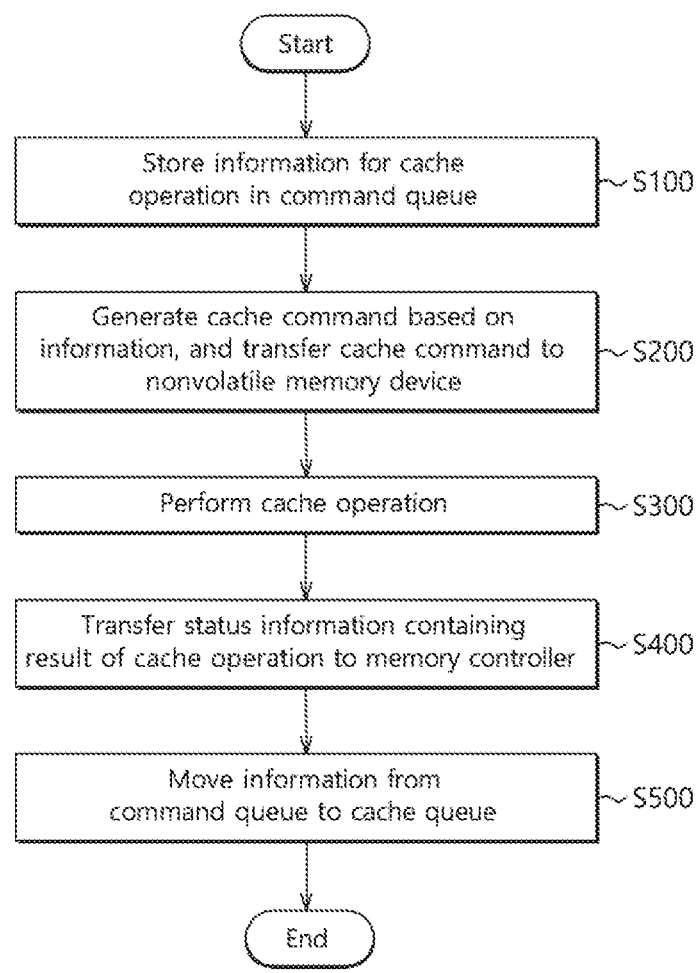
FIGS. 7 to 11B are flow charts illustrating methods for operating a memory system in accordance with embodiments of the present disclosure.

Specifically, FIG. 7 is a flowchart illustrating a method for moving descriptors from the command queue to the cache queue when a cache operation corresponding to the descriptors stored in the command queue is completed.

Figure 8:
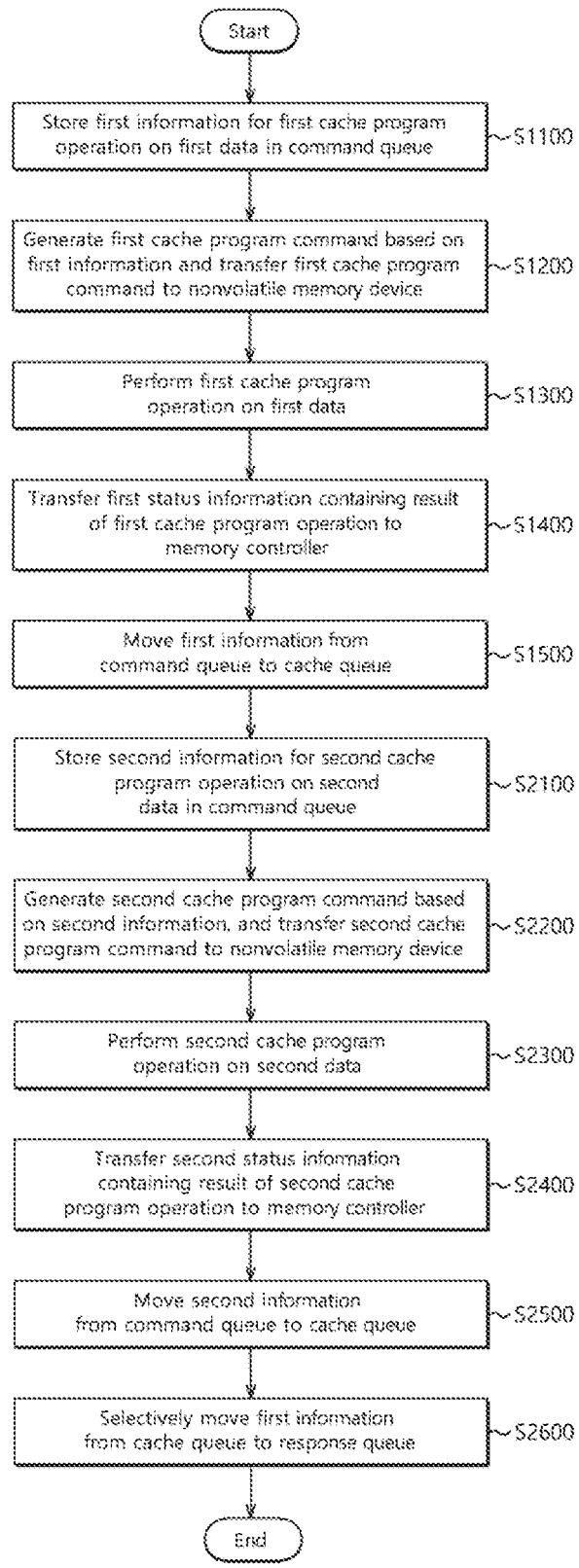
Figure 9A:
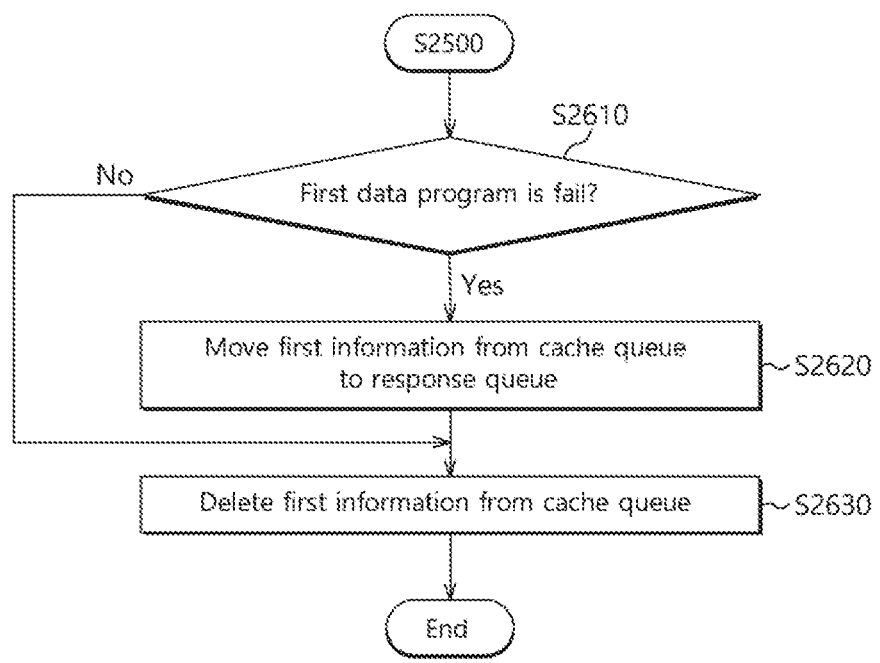
Figure 9B:
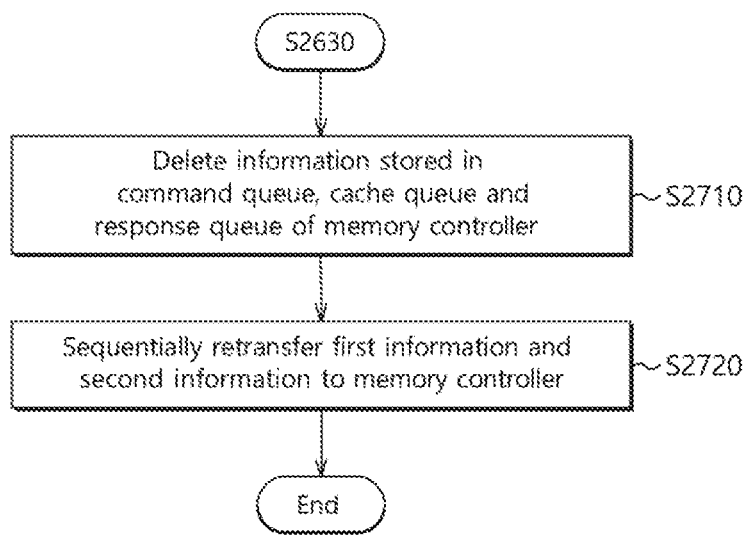

FIGS. 8 to 9B are flowcharts illustrating a method for moving descriptors from the cache queue to the response queue according to the result of a cache program operation.

Figure 10:
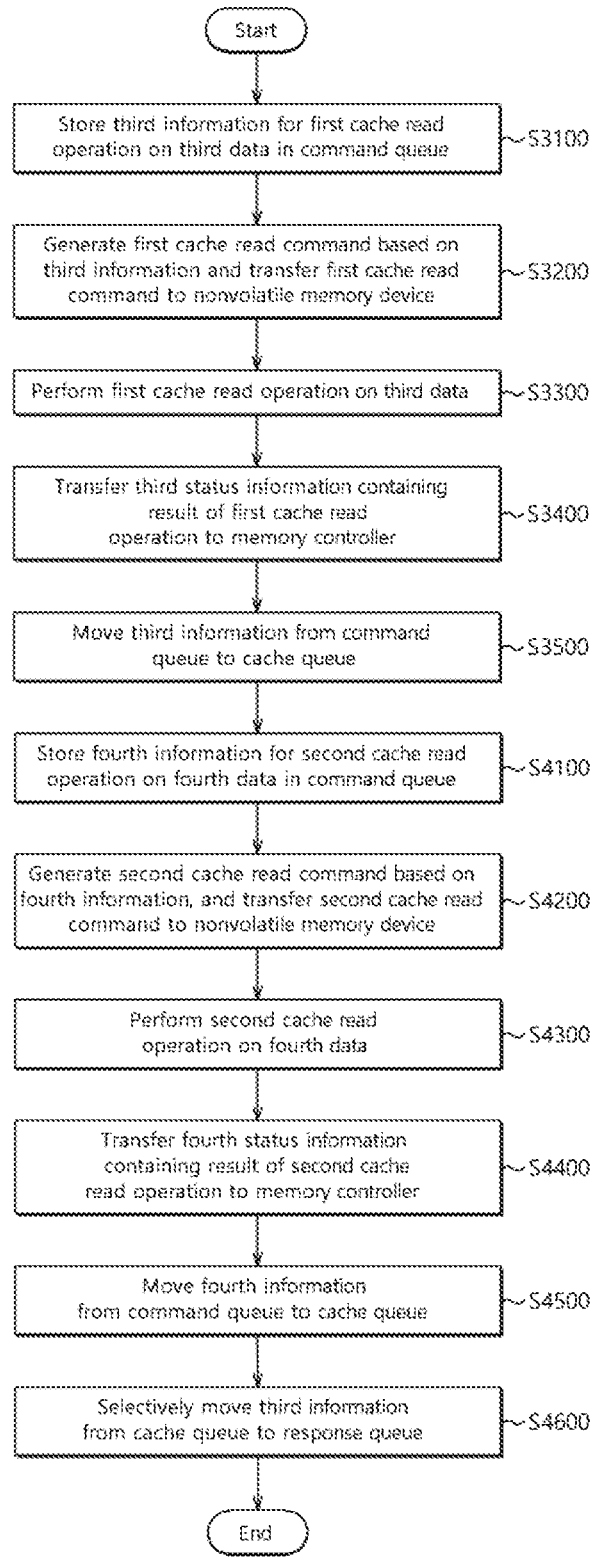
Figure 11A:
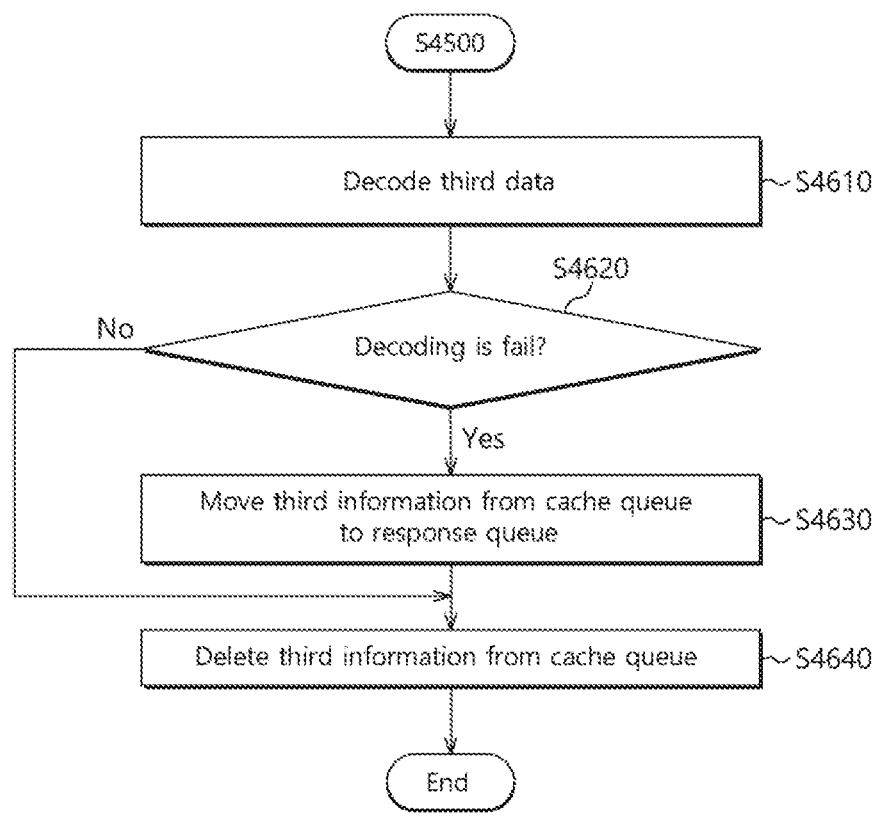
Figure 11B:
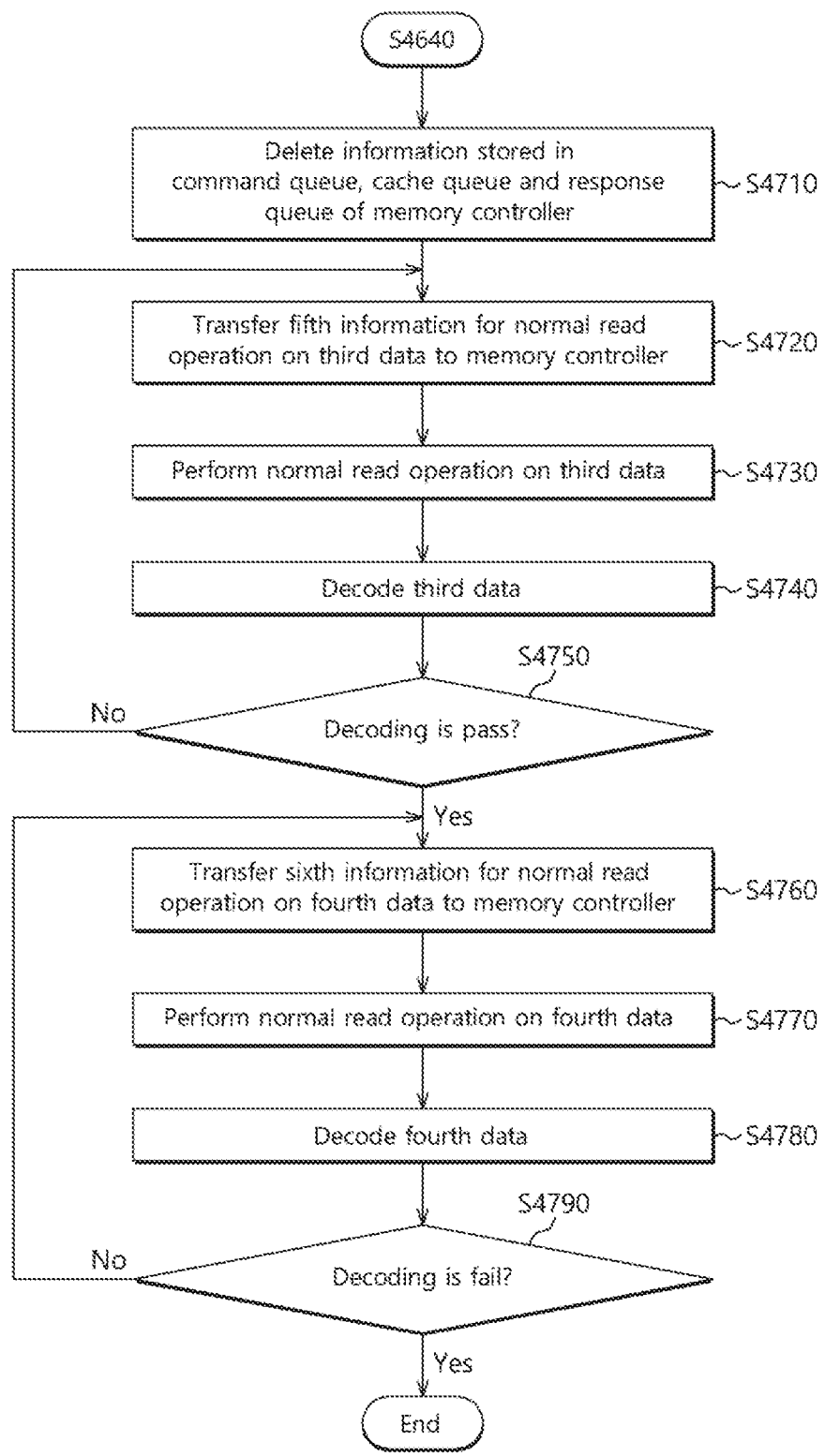

FIGS. 10 to 11B are flowcharts illustrating a method for moving descriptors from the cache queue to the response queue according to the result of a cache read operation.

Referring to FIGS. 2 and 7, the operating method of the memory system 100 in accordance with the present embodiment will be described.

At step S100, the memory controller 210 of the controller 200 may store information (hereafter, referred to as 'descriptors') for a cache operation in the command queue 211. The cache operation may include a cache program operation and a cache read operation. The descriptors may be generated by the FTL, and transferred to the memory controller 210.

At step S200, the memory controller 210 may generate a cache command based on the descriptors stored in the command queue 211, and transfer the generated cache command to the nonvolatile memory device 300.

At step S300, the nonvolatile memory device 300 may perform a cache operation based on the received cache command.

At step S400, the nonvolatile memory device 300 may transfer status information containing the result of the cache operation to the memory controller 210. The status information may include information indicating the completion of the cache operation and information indicating a pass or fail of the cache operation.

At step S500, the memory controller 210 may move the descriptors from the command queue 211 to the cache queue 212. At this time, the memory controller 210 may delete the descriptors from the command queue 211. That is, when the status information is received from the nonvolatile memory device 300, the memory controller 210 may determine that the cache command transferred at step S200 is completed, and move the corresponding descriptors to the cache queue 212 to temporarily store the descriptors into the cache queue 212.

Referring to FIGS. 2 and 8, the operating method of the memory system 100 in accordance with the present embodiment will be described.

At step S1100, the memory controller 210 may store first information (hereafter, referred to as 'first cache program descriptors') for a first cache program operation in the command queue 211. For example, the first cache program operation may include an operation of storing first program data in the page buffer 320 of the nonvolatile memory device 300.

At step S1200, the memory controller 210 may generate a first cache program command based on the first cache program descriptors stored in the command queue 211, and transfer the generated first cache program command to the nonvolatile memory device 300. At this time, the memory controller 210 may transfer the first program data stored in the RAM 220 to the nonvolatile memory device 300.

At step S1300, the nonvolatile memory device 300 may perform the first cache program operation for the first program data, based on the received first cache program command. That is, the nonvolatile memory device 300 may store the first program data in the page buffer 320 according to the first cache program command. When the first program data is completely stored in the page buffer 320, the first cache program operation may be completed.

At step S1400, the nonvolatile memory device 300 may transfer first status information containing the result of the first cache program operation to the memory controller 210. The first status information may include information indicating the completion of the first cache program operation and information indicating a pass or fail of the first cache program operation. For convenience of description, the present embodiment is based on the supposition that there is no cache program operation which was performed before the first cache program operation. Therefore, the first status information may include only information indicating the completion of the first cache program operation.

At step S1500, the memory controller 210 may determine that the first cache program command is completed, and move the first cache program descriptors from the command queue 211 to the cache queue 212. The memory controller 210 may delete the first cache program descriptors from the command queue 211, after moving the first cache program descriptors to the cache queue 212.

At step S2100, the memory controller 210 may store second information (hereafter, referred to as 'second cache program descriptors') for a second cache program operation in the command queue 211. For example, the second cache program operation may include an operation of programming the first program data buffered in the page buffer 320 of the nonvolatile memory device 300 at step S1300 to the memory cell array 310, and an operation of buffering second program data in the page buffer 320 of the nonvolatile memory device 300, the second program data being to be programmed to the memory cell array 310 next to the first program data buffered in the page buffer 320.

At step S2200, the memory controller 210 may generate a second cache program command based on the second cache program descriptors stored in the command queue 211, and transfer the generated second cache program command to the nonvolatile memory device 300. At this time, the memory controller 210 may transfer the second program data stored in the RAM 220 to the nonvolatile memory device 300.

At step S2300, the nonvolatile memory device 300 may perform the second cache program operation based on the received second cache program command. That is, the nonvolatile memory device 300 may store the second program data in the page buffer 320 while programming the first program data stored in the page buffer 320 to the memory cell array 310, according to the second cache program command. When the first program data is completely programmed to the memory cell array 310 and the second program data is completely stored in the page buffer 320, the second cache program operation may be completed.

At step S2400, the nonvolatile memory device 300 may transfer second status information containing the result of the second cache program operation to the memory controller 210. The second status information may include information indicating the completion of the second cache program operation and information indicating a pass or fail of the second cache program operation. For example, the information indicating the completion of the second cache program operation may indicate that that the operation of storing the second program data in the page buffer 320 is completed. The information indicating a pass or fail of the second cache program operation may indicate whether the operation of programming the first program data to the memory cell array 310 is a pass or fail.

At step S2500, the memory controller 210 may determine that the second cache program command is completed, move the second cache program descriptors from the command queue 211 to the cache queue 212, and then delete the second cache program descriptors from the command queue 211.

At step S2600, the memory controller 210 may or may not move the first cache program descriptors from the cache queue 212 to the response queue 213 based on the second status information.

FIG. 9A is a flowchart illustrating step S2600 of FIG. 8 in detail.

At step S2610, the memory controller 210 may determine whether the operation of programming the first data to the memory cell array 310 is a fail or pass, based on the second status information received from the nonvolatile memory device 300. When the operation of programming the first program data to the memory cell array 310 is a pass ("No" at step S2610), the procedure may proceed to step S2630. On the other hand, when the operation of programming the first program data to the memory cell array 310 is a fail ("Yes" at step S2610), the procedure may proceed to step S2620.

At step S2620, the memory controller 210 may move the first cache program descriptors from the cache queue 212 to the response queue 213.

At step S2630, the memory controller 210 may delete the first cache program descriptors from the cache queue 212.

That is, when the second status information contains information indicating a fail of the operation of programming the first program data to the memory cell array 310, the memory controller 210 may move the first cache program descriptors from the cache queue 212 to the response queue 213, and then delete the first cache program descriptors from the cache queue 212. On the other hand, when the second status information contains information indicating a pass of the operation of programming the first program data to the memory cell array 310, the memory controller 210 may not move the first cache program descriptors from the cache queue 212 to the response queue 213, but delete the first cache program descriptors from the cache queue 212.

FIG. 9B is a flowchart illustrating an operating method when the first cache program descriptors is moved to the response queue 213.

At step S2710, the processor 240 of the controller 200 may delete the descriptors stored in the command queue 211, the cache queue 212 and the response queue 213 of the memory controller 210.

At step S2720, the processor 240 may sequentially re-transfer the first cache program descriptors for the first cache program operation and the second cache program descriptors for the second cache program operation to the memory controller 210. The following operations may be performed in the same manner as described in steps S1100 to S2600.

Referring to FIGS. 2 and 10, the operating method of the memory system 100 in accordance with the present embodiment will be described.

At step S3100, the memory controller 210 may store third information (hereafter, referred to as 'first cache read descriptors') for a first cache read operation in the command queue 211. For example, the first cache read operation may include an operation of reading first read data from the memory cell array 310 and storing the first read data in the page buffer 320.

At step S3200, the memory controller 210 may generate a first cache read command based on the first cache read descriptors stored in the command queue 211, and transfer the generated first cache read command to the nonvolatile memory device 300.

At step S3300, the nonvolatile memory device 300 may perform the first cache read operation for the based on the received first cache read command. That is, the nonvolatile memory device 300 may read the first read data from the memory cell array 310, and store the read first read data in the page buffer 320, according to the first cache read command. When the first read data is completely stored in the page buffer 320, the first cache read operation may be completed.

At step S3400, the nonvolatile memory device 300 may transfer third status information containing the result of the first cache read operation to the memory controller 210. The third status information may include information indicating the completion of the first cache read operation.

At step S3500, the memory controller 210 may determine that the first cache read operation is completed, and move the first cache read descriptors from the command queue 211 to the cache queue 212. The memory controller 210 may delete the first cache read descriptors from the command queue 211, after moving the first cache read descriptors to the cache queue 212.

At step S4100, the memory controller 210 may store fourth information (hereafter, referred to as 'second cache read descriptors') for a second cache read operation in the command queue 211. For example, the second cache read operation may include an operation of transferring the first read data to the memory controller 210, the first read data being read from the memory cell array 310 and stored in the page buffer 320 at step S3300, and an operation of reading second read data from the memory cell array 310 and storing the second read data in the page buffer 320, the second read data being to be transferred to the memory controller 210 next to the first read data.

At step S4200, the memory controller 210 may generate a second cache read command based on the second cache read descriptors stored in the command queue 211, and transfer the generated second cache read command to the nonvolatile memory device 300.

At step S4300, the nonvolatile memory device 300 may perform the second cache read operation based on the received second cache read command. That is, the nonvolatile memory device 300 may read the second read data from the memory cell array 310 and store the read second read data in the page buffer 320, while transferring the first read data stored in the page buffer 320 to the memory controller 210, according to the second cache read command. When the first read data is completely transferred to the memory controller 210 and the second read data is completely stored in the page buffer 320, the second cache read operation may be completed.

At step S4400, the nonvolatile memory device 300 may transfer fourth status information containing the result of the second cache read operation to the memory controller 210. The fourth status information may include information indicating the completion of the second cache read operation.

At step S4500, the memory controller 210 may determine that the second cache read command is completed, move the second cache read descriptors from the command queue 211 to the cache queue 212, and then delete the second cache read descriptors from the command queue 211.

At step S4600, the memory controller 210 may or may not move the first cache read descriptors from the cache queue 212 to the response queue 213.

FIG. 11A is a flowchart illustrating step S4600 of FIG. 10 in detail.

At step S4610, the memory controller 210 may decode the first read data received from the nonvolatile memory device 300.

At step S4620, the memory controller 210 may determine whether the decoding of the first read data is a fail. When the decoding is a pass ("No" at step S4620), the procedure may proceed to step S4640. When the decoding is a fail ("Yes" at step S4620), the procedure may proceed to step S4630.

At step S4630, the memory controller 210 may move the first cache read descriptors from the cache queue 212 to the response queue 213.

At step S4640, the memory controller 210 may delete the first cache read descriptors from the cache queue 212.

That is, when the decoding of the first read data read from the memory cell array 310 through the first cache read operation is a fail, the memory controller 210 may move the first cache read descriptors from the cache queue 212 to the response queue 213, and then delete the first cache read descriptors from the cache queue 212. On the other hand, when the decoding of the first read data is a pass, the memory controller 210 may not move the first cache read descriptors from the cache queue 212 to the response queue 213, but delete the first cache read descriptors from the cache queue 212.

FIG. 11B is a flowchart illustrating an operating method when the first cache read descriptors is moved to the response queue 213.

At step S4710, the processor 240 of the controller 200 may delete the descriptors stored in the command queue 211, the cache queue 212 and the response queue 213 of the memory controller 210.

At step S4720, the processor 240 may drive the FLT to generate third descriptors for a normal read operation on the third data (i.e., first read data), and transfer the generated fifth information (hereafter, referred to as 'third descriptors') to the memory controller 210. At this time, the normal read operation may be of reading the first read data from the memory cell array 310, storing the read first read data in the page buffer 320, and transferring the first read data stored in the page buffer 320 to the memory controller 210. The memory controller 210 may generate a normal read command for the first read data based on the third descriptors, and transfer the generated normal read command to the nonvolatile memory device 300.

At step S4730, the nonvolatile memory device 300 may perform the normal read operation of reading the first read data from the memory cell array 310, storing the first read data in the page buffer 320, and transferring the first read data stored in the page buffer 320 to the memory controller 210, according to the normal read command.

At step S4740, the memory controller 210 may decode the first read data received from the nonvolatile memory device 300.

At step S4750, the memory controller 210 may determine whether the decoding of the first read data is a pass. When the decoding is a fail ("No" at step S4750), steps S4720 to S4740 may be performed again. When the decoding is a pass ("Yes" at step S4750), the procedure may proceed to step S4760.

At step S4760, the processor 240 may drive the FTL to generate sixth information (hereafter, referred to as 'fourth descriptors') for a normal read operation on the fourth data (i.e., second read data), and transfer the generated fourth descriptors to the memory controller 210. The memory controller 210 may generate a normal read command for the second read data based on the fourth descriptors, and transfer the generated normal read command to the nonvolatile memory device 300.

At step S4770, the nonvolatile memory device 300 may perform the normal read operation of reading the second read data from the memory cell array 310, storing the read second read data in the page buffer 320, and transferring the second read data stored in the page buffer 320 to the memory controller 210, according to the normal read command.

At step S4780, the memory controller 210 may decode the second read data received from the nonvolatile memory device 300.

At step S4790, the memory controller 210 may determine whether the decoding of the second read data is a pass. When the decoding is a fail ("No" at step S4790), steps S4760 to S4780 may be performed again. When the decoding is a pass ("Yes" at step S4790), the procedure may be ended.

In accordance with the present embodiments, the memory system and the operating method can correctly determine descriptor for data which fails to be stored in a memory and descriptor for decoding-failed data, and perform a program/read operation on the corresponding data again, during the cache program operation and the cache read operation, which makes it possible to improve the reliability of the system.

Figure 12:
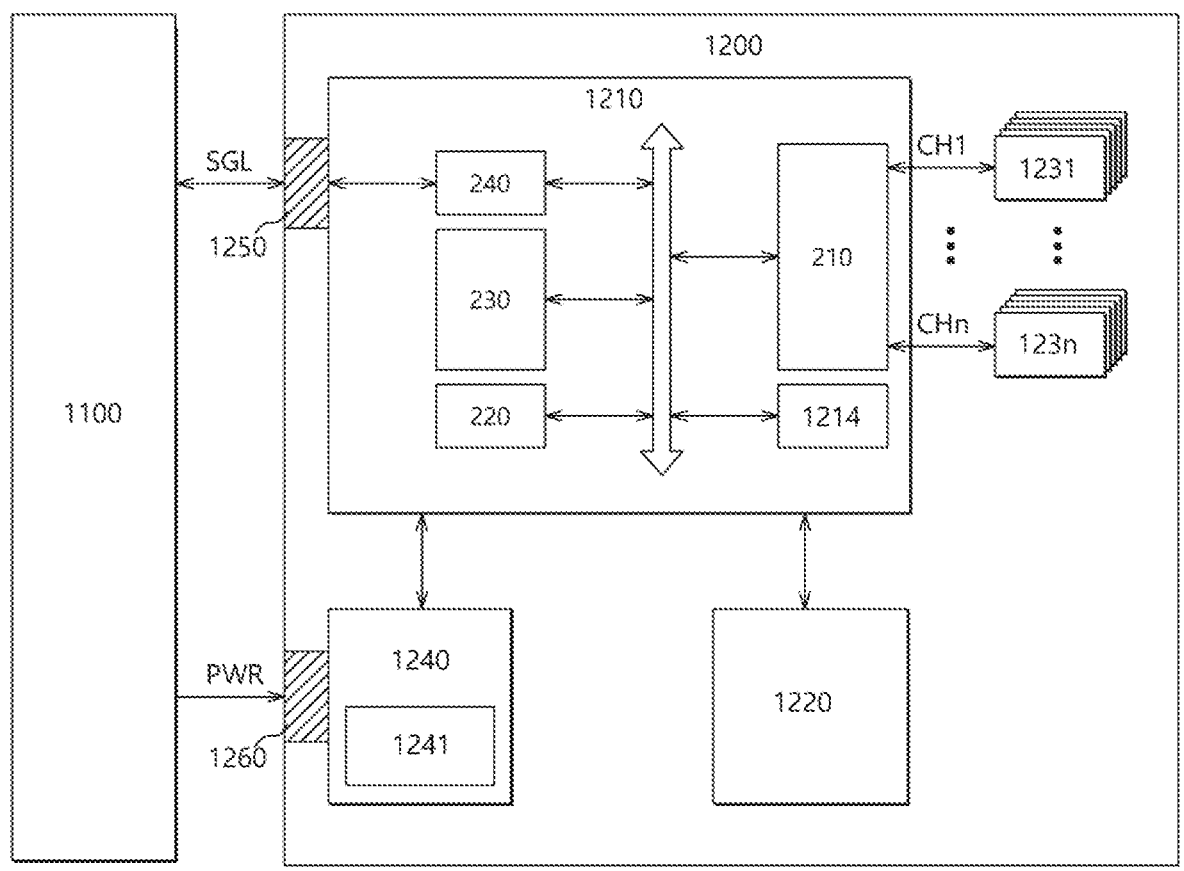
FIG. 12 is a diagram illustrating a data processing system including a solid state drive (SSD) in accordance with an embodiment of the present disclosure.

FIG. 12 is a diagram illustrating a representation of an example of a data processing system including a solid state drive (SSD) in accordance with an embodiment. Referring to FIG. 12, a data processing system 1000 may include a host device 1100 and an SSD 1200.

The SSD 1200 may include a controller 1210, a buffer memory device 1220, nonvolatile memory devices 1231 to 123n, a power supply 1240, a signal connector 1250, and a power connector 1260.

The controller 1210 may control general operations of the SSD 1200. The controller 1210 may include a memory control unit 210, a random access memory 220, a host interface unit 230, a control unit 240 and an error correction code (ECC) unit 1214.

The memory control unit 210 may provide control signals such as commands and addresses to the nonvolatile memory devices 1231 to 123n, according to control of the control unit 240. Moreover, the memory control unit 210 may exchange data with the nonvolatile memory devices 1231 to 123n, according to control of the control unit 240. For example, the memory control unit 210 may provide the data stored in the buffer memory device 1220, to the nonvolatile memory devices 1231 to 123n, or provide the data read out from the nonvolatile memory devices 1231 to 123n, to the buffer memory device 1220.

The host interface unit 230 may exchange a signal SGL with the host device 1100 through the signal connector 1250. The signal SGL may include a command, an address, data, and so forth. The host interface unit 230 may interface the host device 1100 and the SSD 1200 according to the protocol of the host device 1100. For example, the host interface unit 230 may communicate with the host device 1100 through any one of standard interface protocols such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI express (PCI-E) and universal flash storage (UFS).

The control unit 240 may analyze and process a signal SGL inputted from the host device 1100. The control unit 240 may control operations of internal function blocks according to a firmware or a software for driving the SSD 1200. The random access memory 220 may be used as a working memory for driving such a firmware or software.

The error correction code (ECC) unit 1214 may generate the parity data of data to be transmitted to the nonvolatile memory devices 1231 to 123n. The generated parity data may be stored together with the data in the nonvolatile memory devices 1231 to 123n. The error correction code (ECC) unit 1214 may detect an error of the data read out from the nonvolatile memory devices 1231 to 123n, based on the parity data. If a detected error is within a correctable range, the error correction code (ECC) unit 1214 may correct the detected error.

The buffer memory device 1220 may temporarily store data to be stored in the nonvolatile memory devices 1231 to 123n. Further, the buffer memory device 1220 may temporarily store the data read out from the nonvolatile memory devices 1231 to 123n. The data temporarily stored in the buffer memory device 1220 may be transmitted to the host device 1100 or the nonvolatile memory devices 1231 to 123n according to control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 13:
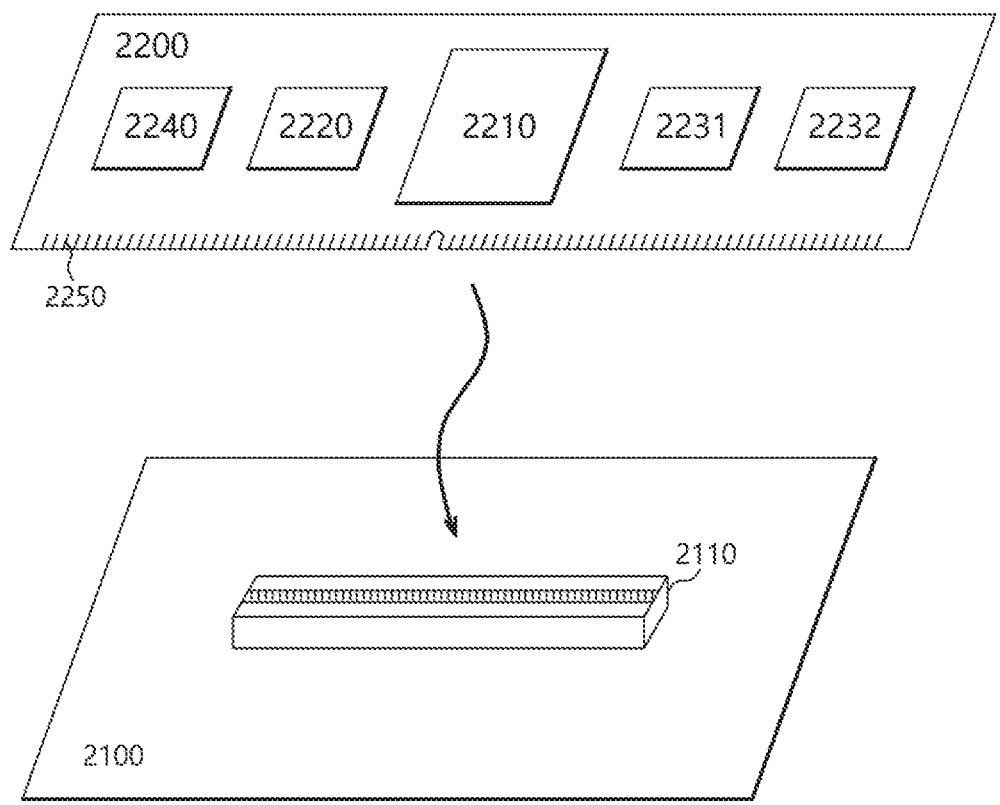
FIGS. 13 and 14 are diagrams illustrating data processing systems each including a memory system in accordance with embodiments of the present disclosure.

FIG. 13 is a diagram illustrating a representation of an example of a data processing system including a memory system in accordance with an embodiment. Referring to FIG. 13, a data processing system 2000 may include a host device 2100 and a memory system 2200.

The host device 2100 may be configured in the form of a board such as a printed circuit board. Although not shown, the host device 2100 may include internal function blocks for performing the function of a host device.

The host device 2100 may include a connection terminal 2110 such as a socket, a slot or a connector. The memory system 2200 may be mounted to the connection terminal 2110.

The memory system 2200 may be configured in the form of a board such as a printed circuit board. The memory system 2200 may be referred to as a memory module or a memory card. The memory system 2200 may include a controller 2210, a buffer memory device 2220, nonvolatile memory devices 2231 and 2232, a power management integrated circuit (PMIC) 2240, and a connection terminal 2250.

The controller 2210 may control the general operations of the memory system 2200. The controller 2210 may be configured in the same manner as the controller 1210 shown in FIG. 12.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as the storage media of the memory system 2200.

The PMIC 2240 may provide the power inputted through the connection terminal 2250, to the inside of the memory system 2200. The PMIC 2240 may manage the power of the memory system 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the memory system 2200. The connection terminal 2250 may be constructed into various types depending on an interface scheme between the host device 2100 and the memory system 2200. The connection terminal 2250 may be disposed on any one side of the memory system 2200.

Figure 14:
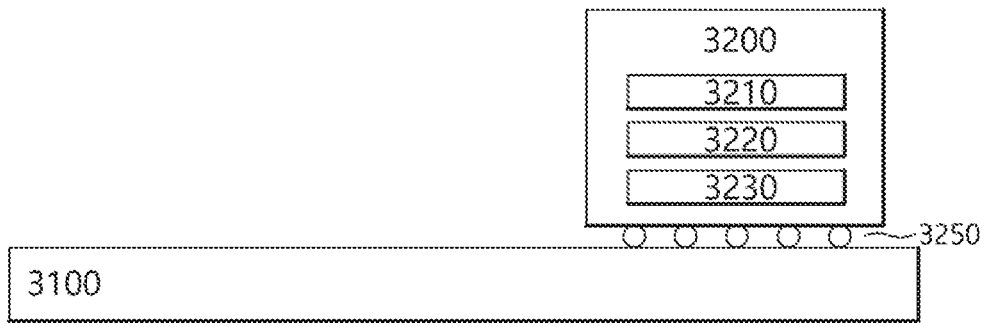

FIG. 14 is a diagram illustrating a representation of an example of a data processing system including a memory system in accordance with an embodiment. Referring to FIG. 14, a data processing system 3000 may include a host device 3100 and a memory system 3200.

The host device 3100 may be configured in the form of a board such as a printed circuit board. Although not shown, the host device 3100 may include internal function blocks for performing the function of a host device.

The memory system 3200 may be configured in the form of a surface-mounting type package. The memory system 3200 may be mounted to the host device 3100 through solder balls 3250. The memory system 3200 may include a controller 3210, a buffer memory device 3220, and a nonvolatile memory device 3230.

The controller 3210 may control the general operations of the memory system 3200. The controller 3210 may be configured in the same manner as the controller 1210 shown in FIG. 12.

The buffer memory device 3220 may temporarily store data to be stored in the nonvolatile memory device 3230. Further, the buffer memory device 3220 may temporarily store the data read out from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the memory system 3200.

Figure 15:
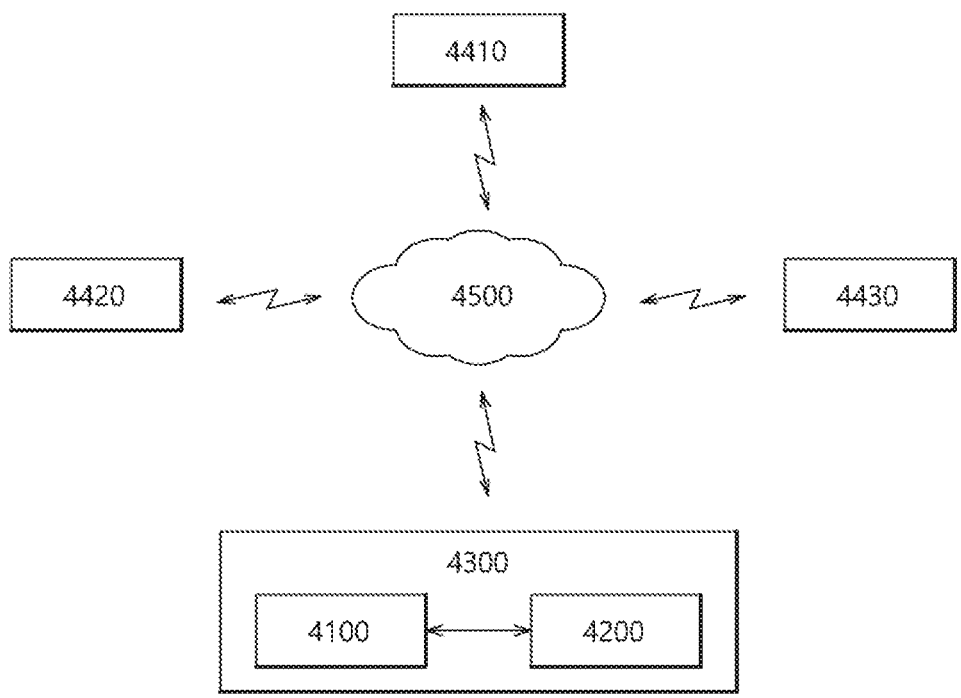
FIG. 15 is a diagram illustrating a network system including a memory system in accordance with an embodiment of the present disclosure.

FIG. 15 is a diagram illustrating a representation of an example of a network system including a memory system in accordance with an embodiment. Referring to FIG. 15, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the memory system 4200. The memory system 4200 may be configured by the memory system 100 of FIG. 1, the SSD 1200 of FIG. 12, the memory system 2200 of FIG. 13 or the memory system 3200 of FIG. 14.

Figure 16:
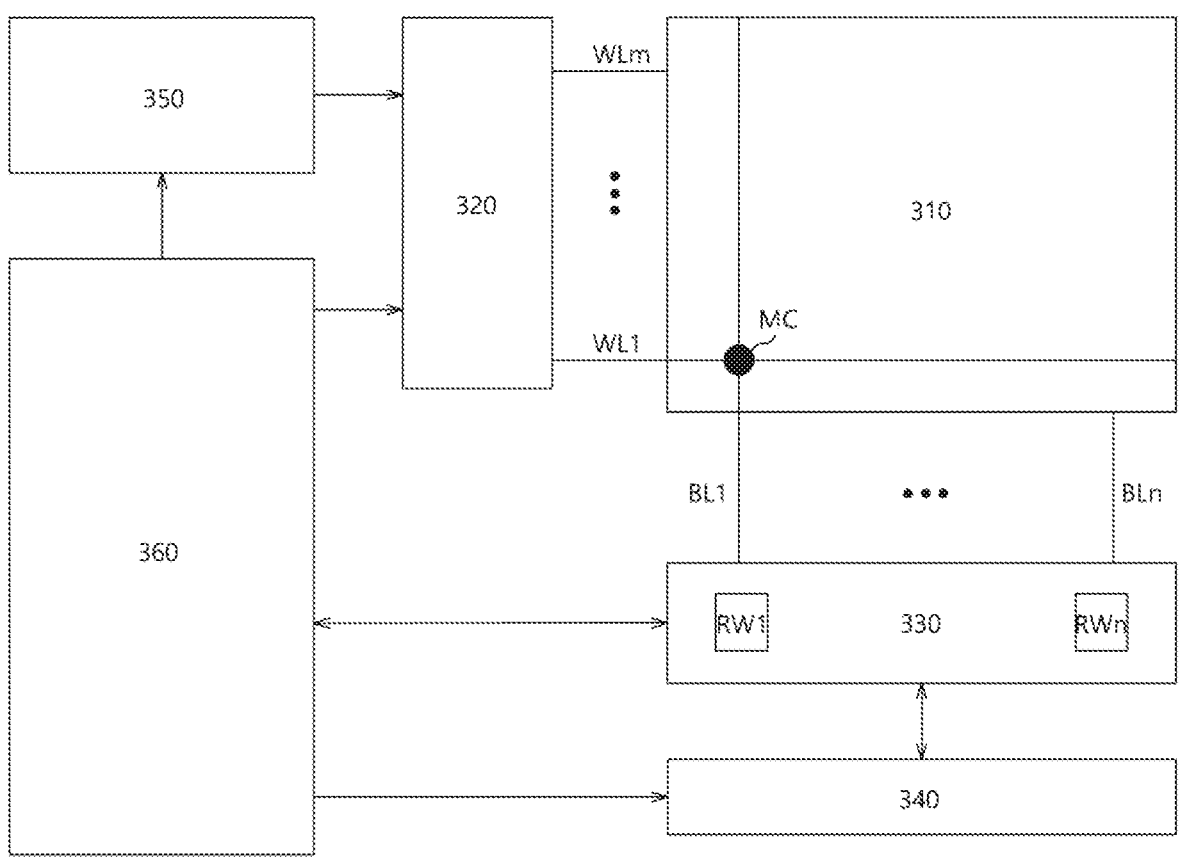
FIG. 16 is a block diagram illustrating a nonvolatile memory device included in a memory system in accordance with an embodiment of the present disclosure.

FIG. 16 is a block diagram illustrating a representation of an example of a nonvolatile memory device included in a memory system in accordance with an embodiment. Referring to FIG. 16, a nonvolatile memory device 300 may include a memory cell array 310, a row decoder 320, a page buffer 330, a column decoder 340, a voltage generator 350, and a control logic 360.

The memory cell array 310 may include memory cells MC which are arranged at areas where word lines WL1 to WLm and bit lines BL1 to BLn intersect with each other.

The page buffer 330 may be coupled with the memory cell array 310 through the bit lines BL1 to BLn. The page buffer 330 may include read/write circuits RW1 to RWn respectively corresponding to the bit lines BL1 to BLn. The page buffer 330 may operate according to the control of the control logic 360. The page buffer 330 may operate as a write driver or a sense amplifier depending on an operation mode. For example, the page buffer 330 may operate as a write driver which stores data provided from the external device, in the memory cell array 310 in a write operation. For another example, the page buffer 330 may operate as a sense amplifier which reads out data from the memory cell array 310 in a read operation.

The row decoder 320 may be coupled with the memory cell array 310 through the word lines WL1 to WLm. The row decoder 320 may operate according to the control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The column decoder 340 may operate according to the control of the control logic 360. The column decoder 340 may decode an address provided from the external device. The column decoder 340 may couple the read/write circuits RW1 to RWn of the page buffer 330 respectively corresponding to the bit lines BL1 to BLn with data input/output lines (or data input/output buffers), based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For still another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control the read, write and erase operations of the nonvolatile memory device 300.

The descriptions for the above-described system may be applied to the methods in accordance with the embodiments of the present disclosure. Therefore, descriptions the same as the descriptions for the above-described system are omitted in the methods.

While various embodiments have been described above, it will be understood to those skilled in the art that the embodiments described are examples only. Accordingly, the memory system and the operating method thereof described herein should not be limited based on the described embodiments.

What is claimed is:

1. A memory system comprising:
a nonvolatile memory device comprising a memory cell array and a page buffer coupled to the memory cell array; and
a controller configured to interface with the nonvolatile memory device,
wherein the controller moves descriptors on a cache command from a command queue to a cache queue, the cache command being transferred to the nonvolatile memory device, and selectively moves the descriptors moved to the cache queue to a response queue.

2. The memory system according to claim 1, wherein the controller generates the cache command based on the descriptors stored in the command queue, and transfers the generated cache command to the nonvolatile memory device.

3. The memory system according to claim 2, wherein the nonvolatile memory device performs a cache operation on the memory cell array and the page buffer according to the cache command, and transfers status information containing the result of the cache operation to the controller.

4. The memory system according to claim 3, wherein the controller moves the descriptors from the command queue to the cache queue when the status information is provided from the nonvolatile memory device.

5. The memory system according to claim 1,
wherein the cache command comprises a first cache program command for first data and a second cache program command for second data, and
wherein the nonvolatile memory device performs a first cache program operation of storing the first data in the page buffer based on the first cache program command, and performs a second cache program operation of programming the first data in the page buffer to the memory cell array and storing the second data in the page buffer, based on the second cache program command.

6. The memory system according to claim 5,
wherein the nonvolatile memory device transfers to the controller first status information containing a result of the first cache program operation and second status information containing a result of the second cache program operation, and
wherein the controller moves a first cache program descriptor corresponding to the first cache program command and a second cache program descriptor corresponding to the second cache program command from the command queue to the cache queue when the first status information and the second status information are received from the nonvolatile memory device.

7. The memory system according to claim 6, wherein the controller moves, when the second status information contains fail information of the second cache program operation, the first cache program descriptor from the cache queue to the response queue.

8. The memory system according to claim 7, wherein the controller deletes the descriptors stored in the command queue, the cache queue and the response queue, and sequentially re-transfers the first and second cache program commands to the nonvolatile memory device.

9. The memory system according to claim 1,
wherein the cache command comprises a first cache read command for first data and a second cache read command for second data, and
wherein the nonvolatile memory device performs a first cache read operation of reading the first data from the memory cell array and storing the first data in the page buffer based on the first cache read command, and performs a second cache read operation of transferring the first data from the page buffer to the controller, reading the second data from the memory cell array, and storing the second data in the page buffer, based on the second cache read command.

10. The memory system according to claim 9,
wherein the nonvolatile memory device transfers to the controller first status information containing a result of the first cache read operation and second status information containing a result of the second cache read operation, and
wherein the controller moves a first cache read descriptor corresponding to the first cache read command and a second cache read descriptor corresponding to the second cache read command from the command queue to the cache queue when the first status information and the second status information are received from the nonvolatile memory device.

11. The memory system according to claim 10, wherein the controller performs error correction code (ECC) decoding on the first data, and moves the first cache read descriptor from the cache queue to the response queue when the ECC decoding is a fail.

12. The memory system according to claim 11, wherein the controller deletes the descriptors stored in the command queue, the cache queue and the response queue, and sequentially transfers a normal read command for the first data and a normal read command for the second data to the nonvolatile memory device.

13. A method for operating a memory system, the method comprising:
storing, by a controller, descriptors for a cache operation on a nonvolatile memory device in a command queue;
generating, by the controller, a cache command based on the descriptors, and transferring the cache command to the nonvolatile memory device;
performing, by the nonvolatile memory device, a cache operation based on the cache command;
transferring, by the nonvolatile memory device, status information containing a result of the cache operation to the controller; and
moving, by the controller, the descriptors from the command queue to a cache queue when the status information is received from the nonvolatile memory device.

14. The method according to claim 13,
wherein the cache command comprises a first cache program command for first data and a second cache program command for second data, and wherein the performing of the cache operation comprises:
performing a first cache program operation of storing the first data in a page buffer of the nonvolatile memory device, based on the first cache program command; and
performing a second cache program operation of programming the first data in the page buffer to a memory cell array of the nonvolatile memory device and storing the second data in the page buffer, based on the second cache program command.

15. The method according to claim 14,
wherein the transferring of the status information includes transferring to the controller first status information containing a result of the first cache program operation and second status information containing a result of the second cache program operation, and
wherein the moving of the descriptors includes moving a first cache program descriptor corresponding to the first cache program command and second cache program descriptors corresponding to the second cache program command from the command queue to the cache queue when the first status information and the second status information are received from the nonvolatile memory device.

16. The method according to claim 15, further comprising:
moving, by the controller, the first cache program descriptors from the cache queue to a response queue when the second status information contains fail information of the second cache program operation; and
deleting, by the controller, the descriptors stored in the command queue, the cache queue and the response queue, and sequentially re-transferring the first and second cache program commands to the nonvolatile memory device.

17. The method according to claim 13,
wherein the cache command comprises a first cache read command for first data and a second cache read command for second data, and
wherein the performing of the cache operation comprises:
performing a first cache read operation of reading the first data from the memory cell array of the nonvolatile memory device and storing the first data in a page buffer of the nonvolatile memory device, based on the first cache read command; and
performing a second cache read operation of transferring the first data in the page buffer to the controller, reading the second data from the memory cell array, and storing the read second data in the page buffer, based on the second cache read command.

18. The method according to claim 17,
wherein the transferring of the status information includes transferring to the controller first status information containing a result of the first cache read operation and second status information containing a result of the second cache read operation, and
wherein the moving of the descriptors includes moving a first cache read descriptor corresponding to the first cache read command and a second cache read descriptor corresponding to the second cache read command from the command queue to the cache queue when the first status information and the second status information are received from the nonvolatile memory device.

19. The method according to claim 18, further comprising:
performing, by the controller, ECC decoding on the first data received from the nonvolatile memory device;
determining, by the controller, whether the ECC decoding on the first data is a fail;
moving, by the controller, the first cache read descriptor from the cache queue to a response queue, when the ECC decoding on the first data is a fail; and
sequentially transferring, by the controller, a normal read command for the first data and a normal read command for the second data to the nonvolatile memory device.

* * * * *